US011133117B2

(12) United States Patent
Larsen et al.

(10) Patent No.: US 11,133,117 B2
(45) Date of Patent: Sep. 28, 2021

(54) ATOMIC INTERFEROMETER SYSTEM

(71) Applicants: Michael S. Larsen, Woodland Hills, CA (US); Thad G. Walker, Middleton, WI (US); Justin M. Brown, Harvard, MA (US)

(72) Inventors: Michael S. Larsen, Woodland Hills, CA (US); Thad G. Walker, Middleton, WI (US); Justin M. Brown, Harvard, MA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/866,931

(22) Filed: May 5, 2020

(65) Prior Publication Data

US 2020/0357534 A1     Nov. 12, 2020

Related U.S. Application Data

(60) Provisional application No. 62/845,110, filed on May 8, 2019.

(51) Int. Cl.
    *G21K 1/00*     (2006.01)
    *G01C 21/24*     (2006.01)

(52) U.S. Cl.
    CPC ............. *G21K 1/006* (2013.01); *G01C 21/24* (2013.01)

(58) Field of Classification Search
    CPC .................................. G21K 1/006; H05H 3/02
    See application file for complete search history.

(56) References Cited

U.S. PATENT DOCUMENTS

| 4,157,495 | A | 6/1979 | Grover et al. |
| 5,227,722 | A | 7/1993 | Kostyk et al. |

(Continued)

FOREIGN PATENT DOCUMENTS

| EP | 2282243 A2 | 2/2011 |
| EP | 3410142 A1 | 12/2018 |

(Continued)

OTHER PUBLICATIONS

Australian Examination Report for Application No. 2020203005 dated Oct. 30, 2020.

(Continued)

*Primary Examiner* — Wyatt A Stoffa
(74) *Attorney, Agent, or Firm* — Tarolli, Sundheim, Covell & Tummino LLP

(57) ABSTRACT

An atom interferometer system includes a sensor cell comprising alkali metal atoms. An optical system generates first and second interrogation beams having respective first and second frequencies and a circular polarization. The optical system includes optics that provide the first and second interrogation beams through the sensor cell in a first direction and reflect the first and second interrogation beams back through the sensor cell in a second direction opposite the first direction and in a same circular polarization to drive the alkali metal atoms from a first energy state to a greater energy state during an interrogation stage of sequential measurement cycles. A detection system detects a state distribution of a population of the alkali metal atoms between the first energy state and the second energy state during the interrogation stage based on an optical response.

25 Claims, 4 Drawing Sheets

(56) References Cited

U.S. PATENT DOCUMENTS

| | | | |
|---|---|---|---|
| 5,620,571 A * | 4/1997 | Bahns | G21K 1/006 |
| | | | 204/157.15 |
| 7,893,780 B2 | 2/2011 | Bulatowicz et al. | |
| 7,965,148 B2 | 6/2011 | Larsen | |
| 8,138,760 B2 | 3/2012 | Bulatowicz | |
| 8,159,220 B2 | 4/2012 | Bulatowicz et al. | |
| 8,330,566 B2 | 12/2012 | Bulatowicz et al. | |
| 8,487,729 B2 | 7/2013 | Bulatowicz | |
| 8,600,691 B2 | 12/2013 | Griffith et al. | |
| 8,994,371 B2 | 3/2015 | Larsen et al. | |
| 9,229,073 B2 | 1/2016 | Walker et al. | |
| 9,329,152 B2 | 5/2016 | Walker et al. | |
| 9,500,725 B2 | 11/2016 | Bulatowicz | |
| 9,618,362 B2 | 4/2017 | Bulatowicz et al. | |
| 9,645,205 B2 | 5/2017 | Larsen et al. | |
| 9,651,378 B2 | 5/2017 | Bulatowicz et al. | |
| 9,726,494 B2 | 8/2017 | Bulatowicz et al. | |
| 9,778,041 B2 | 10/2017 | Griffith | |
| 9,778,328 B2 * | 10/2017 | Bulatowicz | G01C 19/62 |
| 9,970,999 B2 | 5/2018 | Larsen et al. | |
| 10,060,993 B2 | 8/2018 | Larsen et al. | |
| 10,416,245 B2 | 9/2019 | Bulatowicz | |
| 10,451,694 B2 | 10/2019 | Bulatowicz | |
| 10,539,929 B2 | 1/2020 | Larsen et al. | |
| 2004/0140799 A1 | 7/2004 | Romalis et al. | |
| 2009/0272887 A1 | 11/2009 | Fatemi et al. | |
| 2011/0025323 A1 | 2/2011 | Budker et al. | |
| 2011/0073753 A1 * | 3/2011 | Bouyer | G01P 15/006 |
| | | | 250/251 |
| 2012/0113423 A1 | 5/2012 | Groswasser | |
| 2013/0213135 A1 | 8/2013 | Robert et al. | |
| 2013/0328557 A1 | 12/2013 | Larsen et al. | |
| 2014/0013841 A1 | 1/2014 | Italiano et al. | |
| 2014/0022534 A1 | 1/2014 | Strabley et al. | |
| 2014/0319329 A1 * | 10/2014 | Bidel | G01V 7/02 |
| | | | 250/251 |
| 2016/0061913 A1 * | 3/2016 | Kobayashi | G01R 33/26 |
| | | | 324/305 |
| 2016/0298967 A1 | 10/2016 | Johnson et al. | |
| 2018/0101139 A1 * | 4/2018 | Larsen | H05H 3/02 |
| 2018/0348313 A1 | 12/2018 | Bulatowicz et al. | |
| 2018/0372813 A1 | 12/2018 | Bulatowicz et al. | |
| 2019/0101611 A1 | 4/2019 | Bulatowicz et al. | |
| 2020/0011714 A1 | 4/2020 | Larsen | |
| 2020/0117146 A1 * | 4/2020 | Larsen | H05H 3/02 |

FOREIGN PATENT DOCUMENTS

| | | |
|---|---|---|
| JP | 2001092676 A | 4/2001 |
| JP | 2010118553 A | 5/2010 |
| JP | 2012068251 A | 4/2012 |
| JP | 2014115290 A | 6/2014 |
| JP | 2016085200 A | 5/2016 |
| JP | 2016109665 A | 6/2016 |
| JP | 2017173329 A | 9/2017 |
| WO | 2014106811 A2 | 7/2014 |
| WO | 2015/002684 A2 | 1/2015 |
| WO | 2019021010 A1 | 1/2019 |

OTHER PUBLICATIONS

Patton B et al., "A Remotely Interrogated All-Optical Rb Magnetometer", Applied Physics Letters, American Institute of Physics, US, vol. 101, No. 8, Aug. 20, 2012, pp. 83502-83502, XP012164874, ISSN: 0003-6951, DOI: 10.1063/1.4747206 [retrieved on Aug. 21, 2012].

Canuel B et al: "6-axis intertial sensor using cold-atom interferometry", arxiv.org, Cornell University Library, 201 Olin Library Cornell University Ithaca, NY 14853, Apr. 7, 2006 (Apr. 7, 2006), XP080235504, DOI: 10.1103/PHYSREVLETT.97.010402.

Extended European Search Report for Application No. 20173399.5-1001 dated Sep. 24, 2020.

Australian Examination Report for Application No. 2017239529 dated May 5, 2021.

Japanese Office Action for Application No. 2020-082602 dated Jun. 8, 2021.

Gordon E. Lott, et al. "Three-dimensional imaging of trapped cold atoms with a light field microscope" Applied Optics, Nov. 1, 2017, vol. 56, No. 31, pp. 8738-8745.

* cited by examiner

ATOMIC INTERFEROMETER SYSTEM

RELATED APPLICATIONS

This application claims priority from U.S. Provisional Application No. 62/845,110, filed 8 May 2019, which is incorporated herein by reference in its entirety.

TECHNICAL FIELD

The present invention relates generally to sensor systems, and specifically to an atom interferometer system.

BACKGROUND

Optical interferometers are systems that can implement electromagnetic waves (e.g., optical signals) to provide very precise measurements of a measurable parameter. For example, interferometry can implement light from a single light source being split into two beams and provided along two separate optical paths. The two beams can subsequently be combined to determine changes in the relative optical path length of the two interferometer beam paths based on interference between the combined beams. As a result, any parameter that changes the relative length of one beam path vs. the other can be measured using optical interferometry. As an example, the De Broglie wavelength of atoms can also be used to implement an atom interferometer and measure the difference between an atom travelling on one arm of the interferometer relative to the other. In this example, the wave travelling in the interferometer has rest mass and internal energy structures that are sensitive to electro-magnetic fields. For example, the dramatically shorter De Broglie wavelength, as compared to typical optical wavelengths, provides roughly ten orders of magnitude in potential sensitivity increase compared with light based interferometry. As a result, measurable parameters such as time, magnetic field, electric field, acceleration, rotation, and/or a variety of other measurable parameters can be very precisely and accurately measured by atom interferometry. As an example, interferometers can be used in a variety of navigation implementations, such as to assist Global Navigation Satellite systems (GNSS), inertial navigations systems (INS), and other navigation and positioning systems, such as for aircraft, spacecraft, and nautical craft.

SUMMARY

One embodiment includes an atom interferometer system. The system includes a sensor cell comprising alkali metal atoms. An optical system generates first and second interrogation beams having respective first and second frequencies and a circular polarization. The optical system includes optics that provide the first and second interrogation beams through the sensor cell in a first direction and reflect the first and second interrogation beams back through the sensor cell in a second direction opposite the first direction and in a same circular polarization to drive the alkali metal atoms from a first energy state to a greater energy state during an interrogation stage of sequential measurement cycles. A detection system detects a state distribution of a population of the alkali metal atoms between the first energy state and the second energy state during the interrogation stage based on an optical response.

Another example includes a method for measuring at least one measurable parameter via an atom interferometer system. The method includes trapping alkali metal atoms in a sensor cell via trapping light and a magnetic field during a trapping stage of each of sequential measurement cycles. The method also includes providing a first interrogation beam having a first frequency and a second interrogation beam having a second frequency different from the first interrogation beam through the sensor cell in each of a plurality of interrogation cycles in an interrogation stage to provide for absorption of photons in a population of the alkali metal atoms via the first frequency to provide a first photon momentum of the population of the alkali metal atoms in a first direction and to provide for emission of photons in the population of the alkali metal atoms via the second frequency to provide a second photon momentum of the population of the alkali metal atoms in the first direction. The method also includes detecting a transition of the population of the alkali metal atoms between a first energy state and a second energy state, or any combination of the two, resulting from the interrogation stage based on an optical response during a state readout stage. The method further includes determining the at least one measurable parameter based on the detected final state distribution of the alkali metal atoms.

Another example includes an atom interferometer system. The system includes a magneto-optical trapping (MOT) system that traps alkali metal atoms in a sensor cell via a magnetic field and trapping light during a trapping stage of each of sequential measurement cycles. The system also includes an optical system. The optical system includes a first interrogation beam source configured to generate a first interrogation beam having a first frequency and a second interrogation beam source configured to generate a second interrogation beam having a second frequency different from the first frequency. The optical system also includes optics configured to provide the first and second interrogation beams through the sensor cell in a first direction at a first circular polarization to provide for absorption of photons in a population of the alkali metal atoms via the first frequency of the first interrogation beam in the first circular polarization to provide a first photon momentum of the population of the alkali metal atoms in a first momentum direction, and to reflect the first and second interrogation beams through the alkali metal atoms in a second direction opposite the first direction and at the same respective circular polarization to provide for emission of photons in the population of the alkali metal atoms via the second frequency of the second interrogation beam in the first circular polarization to provide a second photon momentum of the population of the alkali metal atoms in the first momentum direction in each of a plurality of interrogation cycles of an interrogation stage. The system further includes a detection system that detects a transition of the population of the alkali metal atoms between a first energy state and a second energy state, or any combination of the two, during the interrogation stage based on an optical response during a state readout stage to measure at least one measurable parameter.

DETAILED DESCRIPTION

Figure 1:
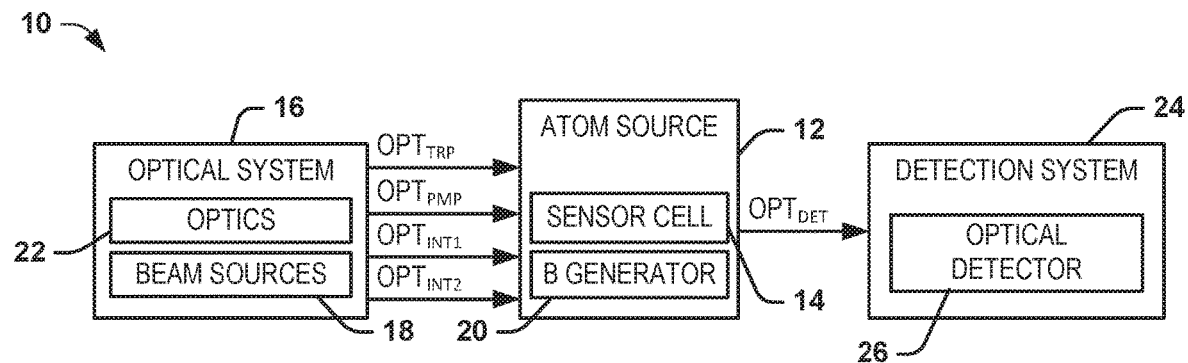
FIG. 1 illustrates an example of an atom interferometer system.

The present invention relates generally to sensor systems, and specifically to an atom interferometer system. The atom interferometer system can be implemented to measure any of a variety of measurable parameters, such as frequency, frequency difference, time, time difference, and/or one or more inertial parameters, such as acceleration, acceleration gradient, and/or rotation. As described herein, the atom interferometer system can implement interrogation of a population of atoms via sequentially provided interrogation beams in a specific manner to measure the measurable parameter(s). Examples of atom interferometry can include sequential Coherent Population Trapping (CPT) based interrogation, Rabi pulse interrogation, or any of a variety of other types of atom interferometry interrogation to measure the transition energy between two states of a population of alkali metal atoms in a sensor cell. As described herein, the atom interferometer system can implement interrogation of the population of atoms in either a CPT or Rabi pulse manner.

As an example, the atom interferometer system can include an atom source (e.g., a magneto-optical trap (MOT) system) that is configured to trap alkali metal atoms in response to a trapping magnetic field and a set of trapping optical beams. As an example, during a trapping stage of each of the measurement cycles, the trapping system can repeatedly excite the alkali metal atoms to an intermediate state (e.g., a hyperfine structure of F'=3 for 87-rubidium) on a cycling transition (i.e., F=2, $m_F$=2→F'=3', $m_{F'}$ =3', hereafter denoted <2,2>-<3',3'>) to provide a source of alkali atoms. Upon trapping the alkali metal atoms to provide a source and the baseline optical response, the trapping system can cease application of the optical trapping beams and the trapping magnetic field to prepare the alkali metal atoms for interrogation.

The atom interferometer system can also include an optical system. The optical system can include a first interrogation beam source that provides the first interrogation beam and a second interrogation beam source that provides the second interrogation beam, with each of the interrogation beams having a different frequency and a same circular polarization with respect to each other. As described herein, the term "circular polarization" refers to a polarization having at least a circular polarization component, such that "circular polarization" encompasses combinations of polarization that includes circularly polarized light, such as an elliptical polarization. Additionally, as also described herein, circular polarization is described herein with reference to a propagation direction of the respective optical beams exhibiting the circular polarization. As further described herein, the term "beam source" refers to any of a variety of ways to provide a respective beam, such as a laser or a set of optics to provide a respective beam from a given laser. For example, multiple beam sources can provide multiple respective beams from a given one laser, such as based on frequency-shifting through acousto-optic or electro-optic modulation, or modulating the current in the respective beam source to generate frequency sidebands to provide the desired frequencies. The optical system can also include one or more optical components (e.g., an optical pumping beam source) that can be implemented for an initial state preparation stage, as described in greater detail herein.

The optical system also includes optics that provide the first and second interrogation beams through the sensor cell in a first direction and reflect the first and second interrogation beams back through the sensor cell in a second direction opposite the first direction and in a same circular polarization. For example, the optics can include a quarter-wave plate and a mirror (e.g., a retroreflective mirror) on the opposite side of the sensor cell. For example, the same optical configuration can be implemented for the trapping system, allowing for common optics to be used for both stages of operation. Therefore, in response to passing through the quarter-wave plate a first time, being reflected from the mirror, and passing through the quarter-wave plate a second time, the circular polarization of the first and second interrogation beams can be the same with respect to the propagation direction of the first and second interrogation beams, but opposite angular momentum with respect to the alkali metal atoms.

The alkali metal atoms can be pumped and can be exposed to a predefined magnetic field to facilitate interrogation by the interrogation beams at a specific frequency and circular polarization combination during an interrogation stage. For example, in response to the pumping and magnetic field, the alkali metal atoms can be interrogated to be driven from a first energy state to an intermediate state (e.g., a hyperfine state for CPT interrogation or a or "virtual" energy state for a Raman transition for Rabi interrogation) in response to the first frequency and the first circular polarization corresponding to absorption of a photon. The alkali metal atoms can then (e.g., subsequently or substantially concurrently) be interrogated to be driven from the intermediate state to a second energy state in response to the second frequency and the first circular polarization corresponding to the emission of a photon. Based on the structure of the optics to facilitate absorption and emission of the photon via the first and second interrogation beams in each of the respective propagation directions, the alkali metal atoms can exhibit a net momentum gain of two photons, such as based on the absorbed photon and emitted photon are in nominally opposite directions based on the counter-propagating interrogation beams, or based on the alkali metal atoms exhibiting a net momentum gain equal to the energy difference of the two photons, if the absorbed photon and emitted photon are in nominally the same directions based on the co-propagating first and second interrogation beams or the co-propagating first and second retro-reflected interrogation beams. As a result, the trapped alkali metal atoms can be interrogated to provide an optical response regardless of velocity of the alkali metal atoms relative to the interrogation beams, as opposed to other atom interferometer systems that are incapable of discerning a net optical response after an interrogation cycle when starting with relatively stationary alkali metal atoms. For example, for a typical atom interferometry system that stimulates atoms on a traditional 0-0 "clock" transition (e.g., for 87-rubidium, <1,0>-<2,0>, or <2,0>-<1, 0>), the ambiguity of zero velocity atoms can lead to mixing of momentum states in both opposite momentum directions, resulting in no net measurement of any quantity that is dependent on a momentum state splitting of the atom interferometer. However, by controlling the momentum direction of the population of the alkali metal atoms based on the net momentum gain of two photons, as described herein, the momentum state splitting can be observed for measurements of the measurable parameter(s) even with stationary atoms.

The interrogation beams can thus drive an interrogation of a population of the alkali metal atoms followed by a state detection phase to obtain an optical response of the alkali metal atoms. As another example, the interrogation of the alkali metal atoms can be provided in a uniform magnetic field that is associated with the Zeeman-shift characteristics of the alkali metal atoms, such that the interrogation of the alkali metal atoms is between a first energy state and a second energy state in a manner that is substantially insensitive to external magnetic fields. As an example, the uniform magnetic field can have a magnitude to provide for a transition frequency that is approximately centered on the interrogation energy transition of the alkali metal atoms from the first energy state to the second energy state (e.g., for 87-rubidium, <1,−1>-<2,1>, or <1,1>-<2,−1>) to provide for minimal dependence on variations in magnetic field (e.g., a purely quadratic Zeeman energy shift dependence for magnetic field centered at an appropriate value). For example, the alkali metal atoms can be 87-rubidium atoms, such that the uniform magnetic field can have a magnitude of approximately 3.23 Gauss.

For example, the optical system can provide the interrogation beams in each of a plurality of interrogation cycles during the interrogation stage. In each of the interrogation cycles, the first interrogation beam can provide for absorption of photon of a population of the alkali metal atoms based on the angular momentum provided by the first circular polarization at the first frequency. The absorption of the photons can thus provide for a first photon momentum of the population of the alkali metal atoms in a first momentum direction. Because the interrogation beams are then reflected and provided back through the sensor cell, the second interrogation beam can provide for emission of a photon of the population of the alkali metal atoms based on the angular momentum provided by the first circular polarization at the second frequency. The emission of the photons can thus provide for a second photon momentum (e.g., approximately equal to the first photon momentum) of the population of the alkali metal atoms in the first momentum direction, and thus increasing the momentum in the first momentum direction (e.g., to a net two photon momentum).

As an example, the interrogation cycles can include providing the interrogation beams in a first $\pi/2$-pulse, such as in traditional Rabi cycling terms, in which the interrogation beams are provided at a given intensity for a predetermined time. The first $\pi/2$-pulse can thus provide an approximate 50% superposition of the alkali metal atoms in the first and second energy states and the original and two photon momentum states. After the first $\pi/2$-pulse, the interrogation cycles can include an intermediate cycle, such as a $\pi$-pulse in which the interrogation beams are provided at an intensity that is approximately twice the amplitude of the first $\pi/2$-pulse (e.g., $\sqrt{2}$ times the intensity), or twice the time at the same intensity as the first $\pi/2$-pulse. The $\pi$-pulse can thus operate to reverse the 50% superposition in both energy state and momentum state distribution of the alkali metal atoms, such that the half of the alkali metal atoms superposition that had not experienced the two photon momentum change then experiences the two photon momentum change, and the half that did experience the two photon momentum change then experiences a two photon momentum change in the opposite direction to counteract the initial two photon momentum change. While the intermediate cycle is described herein as a single $\pi$-pulse, it is to be understood that the atom interferometer system can instead implement a sequence of $\pi$-pulses of alternating circular polarization, such as to provide for higher momentum transfer and greater momentum separation to enhance sensitivity of the atom interferometer system.

The interrogation cycles can further include a second $\pi/2$-pulse in which the interrogation beams are provided at the same intensity as the first $\pi/2$-pulse for a predetermined time at the same circular polarization as the first $\pi/2$-pulse. The second $\pi/2$-pulse can thus provide an approximate 50% superposition of the alkali metal atoms having undergone the energy state transition from the first energy state to the second energy state, and thus having the net momentum in the first momentum direction to restore the alkali metal atoms to a same state as prior to the interrogation stage. As a result, during a state readout stage, any inertial effects having occurred on the alkali metal atoms during the interrogation stage can be detected (e.g., based on an optical response), and the measurable parameter (e.g., acceleration, rotation, time, etc.) can be determined based on the final energy and momentum state distribution of the atoms. Implementation of a Mach-Zehnder (e.g., $\pi/2$-$\pi$-$\pi/2$) pulse sequence is just one example of a wide array of interferometer interrogation sequences that could be implemented, such that it is to be understood that other types of interrogation cycles or other higher momentum transfer techniques can be implemented during the interrogation stage.

As an example, the optics of the optical system of the atom interferometer system can be implemented in a more efficient and cost-effective manner relative to typical atom interferometer systems. For example, the optics can be arranged to provide the first and second interrogation beams, as well as the reflected versions of the first and second interrogation beams, along each of three orthogonal axes X, Y, and Z, or along non-orthogonal geometries. Therefore, the optics can be such that the interrogation beams can be provided along the same optical path as the optical trapping light. Furthermore, the atom interferometer system can be implemented in a sensor system that is configured to adjust and/or calibrate a measurement of a measurable parameter that is provided from a sensor. For example, the sensor system can be configurable via user inputs that can tune characteristics of the first and second interrogation beams. As a result, the atom interferometer system can be programmed to provide measurements of one of a plurality of predefined measurable parameters of which it is configured to measure.

FIG. 1 illustrates an example of an atom interferometer system 10. The atom interferometer system 10 can be implemented in any of a variety of applications that require highly stable measurements of a measurable parameter, such as in an inertial navigation system (INS) of an aerospace vehicle. The atom interferometer system 10 includes an atom source 12 that is configured to trap alkali metal atoms in a sensor cell 14. The source of the alkali metal atoms in the sensor cell 14 can be based on any of a variety of techniques, such as thermal beams, hot vapor, etc. or trapping techniques to provide for cold, partially confined, or other types of atom trapping can be implemented. As an example, the atom source 12 can be configured as a magneto-optical trap (MOT) system. For example, the alkali metal atoms can be 87-rubidium, but are not limited to 87-rubidium and could instead correspond to a different alkali metal (e.g., 133-cesium). As an example, the alkali metal atoms can be trapped in the sensor cell 14 then further cooled in an "optical molasses" in response to application of an optical trapping beam and application and removal of a trapping magnetic field. For example, each of the measurement cycles can include a trapping stage, during which the alkali metal atoms can be trapped by the atom source 12.

In each of the measurement cycles, subsequent to the trapping stage, an interrogation stage is initiated. In the example of FIG. 1, the atom interferometer system 10 includes an optical system 16. The optical system 16 includes a plurality of beam sources 18 that are configured to generate optical beams that are provided to the sensor cell 14. In the example of FIG. 1, the optical beams include one or more optical trapping beams $OPT_{TRP}$, an optical pump beam $OPT_{PMP}$, and a pair of interrogation beams $OPT_{INT1}$ and $OPT_{INT2}$. The optical trapping beam(s) $OPT_{TRP}$ are provided during the trapping stage, as described previously, to provide trapping of the alkali metal atoms in the sensor cell 14. The optical pump beam $OPT_{TRP}$ can be provided to polarize the alkali metal atoms in the presence of a substantially uniform magnetic field generated by a magnetic field generator ("B GENERATOR") 20 to prepare the alkali metal atoms for interrogation during an interrogation stage. As an example, the optical trapping beams $OPT_{TRP}$, the optical pump beam $OPT_{PMP}$, and the pair of interrogation beams $OPT_{INT1}$ and $OPT_{INT2}$ can be provided along any of the axes of the atom interferometer system 10 (e.g., X, Y, and Z orthogonal axes) to allow for interrogation of the alkali metal atoms along any of the respective axes, as described in greater detail herein.

The first and second interrogation beams $OPT_{INT1}$ and $OPT_{INT2}$ are provided through the sensor cell 14 in a first direction and in a second direction opposite the first direction to drive interrogation of a population of the alkali metal atoms. As an example, the first and second interrogation beams $OPT_{INT1}$ and $OPT_{INT2}$ can have respective first and second frequencies and can each have a first circular polarization in the first direction through the sensor cell 14. The optical system 16 includes optics 22 that are configured to direct the optical trapping beam(s) $OPT_{TRP}$ and the first and second interrogation beams $OPT_{INT1}$ and $OPT_{INT2}$ through the sensor cell 14, such as along common respective optical paths. For example, as described in greater detail herein, the first and second interrogation beams $OPT_{INT1}$ and $OPT_{INT2}$ can propagate along an optical path that is common to one of the optical trapping beams $OPT_{TRP}$ in a three orthogonal axis optical trapping scheme. The optics 22 are also configured to provide the first and second interrogation beams $OPT_{INT1}$ and $OPT_{INT2}$ back through sensor cell 14 in the second direction opposite the first direction at a same circular polarization through the sensor cell 14. For example, the optics 22 can include a quarter-wave plate and a mirror (e.g., a retroreflective mirror) to reflect the first and second interrogation beams $OPT_{INT1}$ and $OPT_{INT2}$ back through the sensor cell 14 at the same circular polarization and opposite angular momentum. Therefore, in response to passing through the quarter-wave plate a first time, being reflected from the mirror, and passing through the quarter-wave plate a second time, the circular polarization of the first and second interrogation beams $OPT_{INT1}$ and $OPT_{INT2}$ can be reversed. Therefore, while the circular polarization of the first and second interrogation beams $OPT_{INT1}$ and $OPT_{INT2}$ is the same in each propagation direction through the sensor cell 14 with respect to the propagation direction of the $OPT_{INT1}$ and $OPT_{INT2}$, the angular momentum is opposite with respect to the alkali metal atoms in the sensor cell 14.

The alkali metal atoms can therefore be stimulated to transition between a first energy state and a second energy state based on a specific frequency and circular polarization combination of the first and second interrogation beams $OPT_{INT1}$ and $OPT_{INT2}$ during each of a plurality of interrogation cycles of an interrogation stage. For example, in response to the pumping and magnetic field, the alkali metal atoms can be interrogated to be driven from a first energy state to an intermediate state in response to the first frequency and the first circular polarization corresponding to absorption of a photon (e.g., based on an angular momentum of the alkali metal atoms of σ+ or σ−). The alkali metal atoms can then (e.g., subsequently or substantially concurrently) be interrogated to be driven from the intermediate state to a second energy state in response to the second frequency and the first circular polarization corresponding to the emission of a photon (e.g., based on a respective opposite angular momentum of the alkali metal atoms of σ− or σ+). For example, the first interrogation beam $OPT_{INT1}$ at the first frequency and the first circular polarization can facilitate absorption of a photon by a population of the trapped alkali metal atoms, and the second interrogation beam $OPT_{INT2}$ at the second frequency and the first circular polarization can facilitate emission of a photon by a population of the trapped alkali metal atoms. Based on the structure of the optics 22 to facilitate absorption and emission of the photon via the first and second interrogation beams $OPT_{INT1}$ and $OPT_{INT2}$ from opposite directions, the alkali metal atoms can exhibit a net momentum gain of two photons (e.g., $\hbar k_{eff} = \hbar(k_1 + k_2)$), given that the absorption and emission of the photon are in the same approximate direction based on the counter-propagation of the first interrogation beam $OPT_{INT1}$ at the first circular polarization and the second interrogation beam $OPT_{INT2}$ at the first circular polarization. As a result of the dipole selection rules at the operating magnetic field, the trapped alkali metal atoms can be interrogated to provide an optical response regardless of velocity of the alkali metal atoms relative to the interrogation beams $OPT_{INT1}$ and $OPT_{INT2}$, as opposed to typical atom interferometer systems that are incapable of discerning absorption and emission of photons for relatively stationary alkali metal atoms.

As an example, the interrogation cycles can include providing the interrogation beams $OPT_{INT1}$ and $OPT_{INT2}$ in a first π/2-pulse in which the interrogation beams $OPT_{INT1}$ and $OPT_{INT2}$ are provided at a given intensity for a predetermined time. The first π/2-pulse can thus provide an approximate 50% superposition of the alkali metal atoms in both energy and momentum state. After the first π/2-pulse, the interrogation cycles can include a π-pulse in which the interrogation beams are provided at approximately the same intensity and twice the time of the first π/2-pulse at the same circular polarization of each of the interrogation beams $OPT_{INT1}$ and $OPT_{INT2}$ as provided in the first π/2-pulse. As another example, the π-pulse can be provided at approximately the twice the amplitude and approximately the same duration of time as the first π/2-pulse. The π-pulse can thus operate to reverse the 50% superposition in both energy and momentum state, bringing the two superpositions halves of the alkali metal atoms in the sensor cell 14 back together. While the intermediate cycle is described herein as a single π-pulse, it is to be understood that the atom interferometer system 10 can instead implement a sequence of π-pulses of alternating circular polarization or other techniques, such as to provide for higher momentum transfer and greater momentum separation to enhance sensitivity of the atom interferometer system 10.

The interrogation cycles can further include a second π/2-pulse in which the interrogation beams $OPT_{INT1}$ and $OPT_{INT2}$ are provided at the same intensity as the first π/2-pulse for a predetermined time at the same circular polarization as the first π/2-pulse. The second π/2-pulse can thus close the interferometer providing an approximate 50% superposition of the alkali metal atoms having undergone the energy state transition from the first energy state to the second energy state, and thus having the net momentum in the first momentum direction to restore the alkali metal atoms to a same state as prior to the interrogation stage. As a result, during a state readout stage, any inertial effects having occurred on the alkali metal atoms along the sensitive axis during the interrogation stage can be detected (e.g., based on an optical response), and the measurable parameter (e.g., acceleration, rotation, time, etc.) can be determined.

The interrogation beams $OPT_{INT1}$ and $OPT_{INT2}$ can thus drive an interrogation of a population of the alkali metal atoms followed by a state detection phase to obtain an optical response of the alkali metal atoms. As another example, the interrogation of the alkali metal atoms can be provided in a uniform magnetic field that is associated with the Zeeman-shift characteristics of the alkali metal atoms, such that the interrogation of the alkali metal atoms is between a first energy state and a second energy state in a manner that is substantially insensitive to external magnetic fields. As an example, the uniform magnetic field generated by the magnetic field generator 20 can have a magnitude to provide for a transition frequency that is approximately centered on the interrogation energy transition of the alkali metal atoms from the first energy state to the second energy state e.g., for 87-rubidium, <1,−1>-<2,1>, or <1,1>-<2,−1>) to provide for minimal dependence on variations in magnetic field (e.g., a zero slope of the Zeeman energy shift of the transition between the first and second states). For example, the alkali metal atoms can be 87-rubidium atoms, such that the uniform magnetic field can have a magnitude of approximately 3.23 Gauss.

The interrogation of the alkali metal atoms can provide an optical response, demonstrated in the example of FIG. 1 as a signal $OPT_{DET}$, obtained over multiple measurement cycles to determine a measurable parameter. In the example of FIG. 1, the optical response $OPT_{DET}$ is provided to a detection system 24 that includes an optical detector 26. The detection system 24 can determine the measurable parameter based on interferometry in response to the optical response $OPT_{DET}$. As an example, the optical detector 26 can determine a fluorescence or absorption of the optical response $OPT_{DET}$, or any of a variety of optical detection techniques that can be evaluated via interferometry to determine a measurable parameter based on the configuration of the interferometer. As described in greater detail herein, the detection system 24 can be configured to determine the measurable parameter as one or more of frequency, frequency difference, time, time difference, and/or one or more inertial parameters (e.g., acceleration, acceleration gradient, and/or rotation). As also described herein, the detection system 24 can be programmable to flexibly change the measurable parameter that the atom interferometer system 10 can measure.

Figure 2:
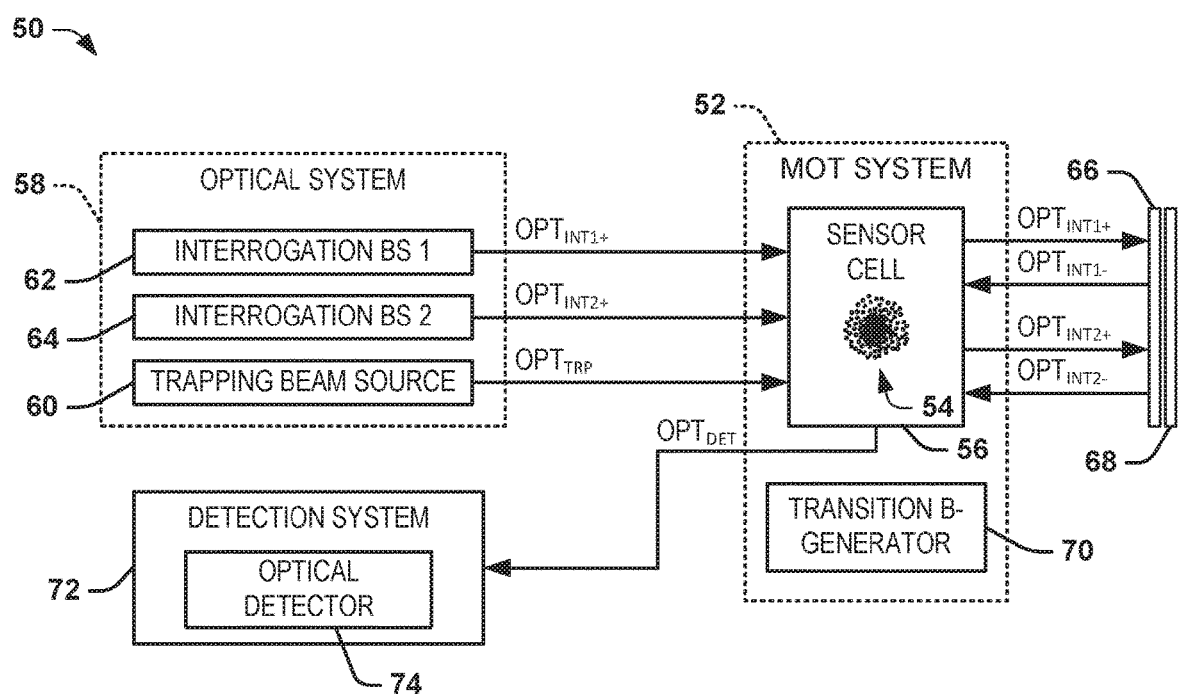
FIG. 2 illustrates another example of an atom interferometer system.

FIG. 2 illustrates another example of an atom interferometer system 50. The atom interferometer system 50 can be implemented to determine a measurable parameter based on a sequence of measurement cycles.

The atom interferometer system 50 includes an MOT system 52 that is configured to trap alkali metal atoms 54 confined in a sensor cell 56. In the example of FIG. 2, the sensor cell 56 can be formed from transparent glass that substantially mitigates optical losses. For example, the alkali metal atoms 54 can be 87-rubidium. The atom interferometer system 50 also includes an optical system 58 that includes a trapping beam source 60 that is configured to generate an optical trapping beam $OPT_{TRP}$. Each of the measurement cycles can begin with a trapping stage, during which the alkali metal atoms 54 can be trapped by the MOT system 52 via the optical trapping beam $OPT_{TRP}$ and a trapping magnetic field. While the atom interferometer system 50 is demonstrated as including an atom source configured as an MOT, it is to be understood that other methods of trapping the alkali metal atoms 54 can be implemented in the atom interferometer system 50.

The optical system 58 also includes a first beam source 62 that is configured to generate a first interrogation beam $OPT_{INT1+}$ and a second beam source 64 that is configured to generate a second optical beam $OPT_{INT2+}$. The first and second interrogation beams $OPT_{INT1+}$ and $OPT_{INT2+}$ are provided through the sensor cell 56 via optics (not shown) in a first direction and in a second direction opposite the first direction to drive interrogation of a population of the alkali metal atoms 54. As an example, the first and second interrogation beams $OPT_{INT1+}$ and $OPT_{INT2+}$ can have respective first and second frequencies and can each have a first circular polarization in the first direction through the sensor cell 56. As an example, the optics can be configured to direct the optical trapping beam $OPT_{TRP}$ (e.g., corresponding to one of three orthogonal axes) and the first and second interrogation beams $OPT_{INT1+}$ and $OPT_{INT2+}$ through the sensor cell 56, such as along a common respective optical path. In the example of FIG. 2, the atom interferometer system 50 includes a quarter-wave plate 66 and a mirror 68 on an opposite side of the sensor cell 56. For example, the quarter-wave plate 66 and the mirror 68 can be part of the optics (e.g., the optics 22) to provide the first and second interrogation beams $OPT_{INT1+}$ and $OPT_{INT2+}$ back through sensor cell 56 in the second direction opposite the first direction at a same circular polarization. For example, the mirror 68 can be a retroreflective mirror to reflect the first and second interrogation beams $OPT_{INT1+}$ and $OPT_{INT2+}$ as first and second interrogation beams $OPT_{INT1-}$ and $OPT_{INT2-}$ back through the sensor cell 56 at the same circular polarization. Therefore, in response to passing through the quarter-wave plate 66 a first time, being reflected from the mirror 68, and passing through the quarter-wave plate 66 a second time, the circular polarization of the first and second interrogation beams $OPT_{INT1+}$ and $OPT_{INT2+}$ can remain the same to provide the first and second interrogation beams $OPT_{INT1-}$ and $OPT_{INT2-}$.

The alkali metal atoms 54 can therefore be stimulated to transition between a first energy state and a second energy state based on a specific frequency and circular polarization combination of the first and second interrogation beams $OPT_{INT1+}$ and $OPT_{INT2+}$ and the first and second interrogation beams $OPT_{INT1-}$ and $OPT_{INT2-}$ during an interrogation stage. In the example of FIG. 2, the MOT system 52 includes a magnetic field generator 70 ("TRANSITION B GENERATOR"). For example, in response to the pumping and a magnetic field provided by the magnetic field generator 70, the alkali metal atoms can be interrogated to be driven from a first energy state to an intermediate state in response to the first frequency and the first circular polarization corresponding to absorption of a photon. For example, the pumping and the magnetic field can provide for sensitivity of the alkali metal atoms 54 to absorb a photon from the first interrogation beam $OPT_{INT1+}$ while being insensitive to the second interrogation beam $OPT_{INT2+}$ (or absorb a photon from the counter-propagating first interrogation beam $OPT_{INT1-}$ while being insensitive to the counter-propagating second interrogation beam $OPT_{INT2-}$).

Therefore, the alkali metal atoms 54 can then (e.g., subsequently or substantially concurrently) be interrogated to drop from the intermediate state to a second energy state in response to the second frequency and the first circular polarization corresponding to the emission of a photon. For example, the pumping and the magnetic field can provide for sensitivity of the alkali metal atoms 54 to emit a photon in response to the second interrogation beam $OPT_{INT2-}$ while being insensitive to the first interrogation beam $OPT_{INT1-}$ (or emit a photon from the forward-propagating second interrogation beam $OPT_{INT2+}$ while being insensitive to the forward-propagating first interrogation beam $OPT_{INT1+}$). Accordingly, based on the structure of the quarter-wave plate 66 and the mirror 68 to facilitate absorption and emission of the photon via the first and second interrogation beams $OPT_{INT1+}$ and $OPT_{INT2-}$ from opposite directions, the alkali metal atoms can exhibit a net momentum gain of two photons, given that the absorption and emission of the photon are in the same approximate direction based on the counter-propagation of the first interrogation beam $OPT_{INT1+}$ and the second interrogation beam $OPT_{INT2-}$. As a result, the trapped alkali metal atoms can be interrogated to provide an optical response regardless of velocity of the alkali metal atoms relative to the interrogation beams $OPT_{INT1}$ and $OPT_{INT2}$, as opposed to typical atom interferometer systems that are incapable of discerning absorption and emission of photons for relatively stationary alkali metal atoms.

The interrogation beams $OPT_{INT1}$ and $OPT_{INT2}$ can thus drive an interrogation of a population of the alkali metal atoms 54 followed by a state detection phase to obtain an optical response of the alkali metal atoms 54. As another example, the interrogation of the alkali metal atoms 54 can be provided in a uniform magnetic field that is associated with the Zeeman-shift characteristics of the alkali metal atoms 54, such that the interrogation of the alkali metal atoms is between a first energy state and a second energy state in a manner that is substantially insensitive to external magnetic fields. As an example, the uniform magnetic field generated by the magnetic field generator 70 can have a magnitude to provide for a transition frequency that is approximately centered on the interrogation energy transition of the alkali metal atoms from the first energy state to the second energy state (e.g., <1,−1>-<2,1> or <1,1>-<2,−1>) to provide for minimal dependence on variations in magnetic field (e.g., to reject other energy transitions). For example, the alkali metal atoms can be 87-rubidium atoms, such that the uniform magnetic field can have a magnitude of approximately 3.23 Gauss.

Similar to as described in the example of FIG. 1, the interrogation of the alkali metal atoms 54 can provide an optical response, demonstrated in the example of FIG. 2 as a signal $OPT_{DET}$, obtained over multiple measurement cycles to determine a measurable parameter. In the example of FIG. 2, the optical response $OPT_{DET}$ is provided to a detection system 72 that includes an optical detector 74. The detection system 72 can determine the measurable parameter based on interferometry in response to the optical response $OPT_{DET}$. As an example, the optical detector 74 can determine a fluorescence or absorption (or any other optical detection technique) of the optical response $OPT_{DET}$ that can be evaluated via interferometry to determine a measurable parameter based on the configuration of the atom interferometer system 50. As described in greater detail herein, the detection system 72 can be configured to determine the measurable parameter as one or more of frequency, frequency difference, time, time difference, and/or one or more inertial parameters (e.g., acceleration, acceleration gradient, and/or rotation). As also described herein, the detection system 72 can be programmable to flexibly change the measurable parameter that the atom interferometer system 50 can measure.

Figure 3:
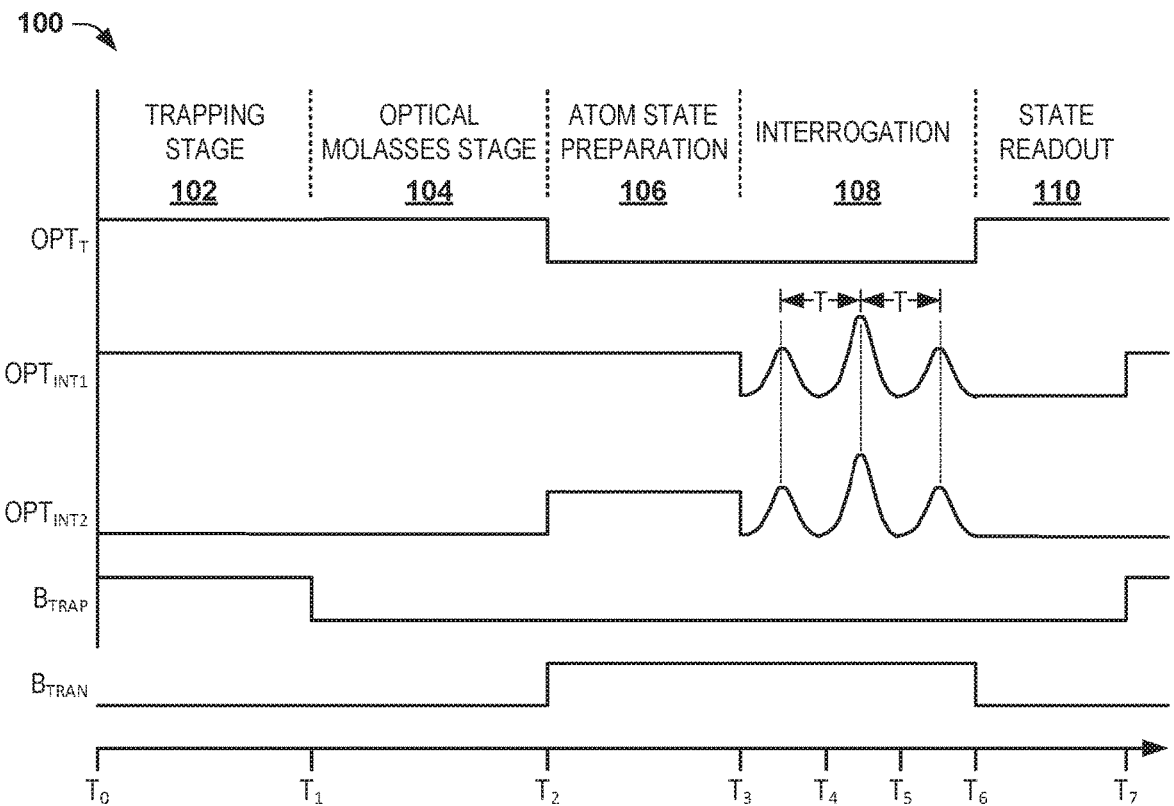
FIG. 3 illustrates an example of a timing diagram.

FIG. 3 illustrates an example of a timing diagram 100. The timing diagram 100 corresponds to the timing of each measurement cycle with respect to the signals and timing that define the given measurement cycle. Reference is to be made to the examples of FIGS. 1 and 2 in the following description of the example of FIG. 3.

The timing diagram 100 demonstrates the separate stages of each of the measurement cycles. It is to be understood that the stages are not demonstrated as scaled with respect to each other, and/or some of the stages described herein may not be mandatory. Beginning at a time $T_0$, the measurement cycle begins with the trapping stage 102. At the time $T_0$, the optical trapping beam $OPT_{TRP}$ is provided through the sensor cell 56, as well as a trapping magnetic field. In addition, as described previously, the alkali metal atoms 54 may receive additional stimulus (e.g., pumping via the optical pump beam $OPT_{PMP}$) to ensure excitation of substantially the entirety of the alkali metal atom population.

At a time $T_1$, the measurement cycle transitions to an optical molasses stage 104. At the time $T_1$, the optical trapping beam $OPT_{TRP}$ is maintained through the sensor cell 56, but the trapping magnetic field is deactivated. As a result, the optical trapping beam $OPT_{TRP}$ can provide further cooling of the alkali metal atoms 54. For example, the alkali metal atoms 54 can reduce in temperature to near absolute zero (e.g., approximately 5 μK), such that the alkali metal atoms 54 can greatly reduce in diffusion velocity (e.g., a few centimeters per second). As a result, the alkali metal atoms 54 can be substantially contained in preparation for interrogation. As an example, the optical molasses stage 104 can have a duration of approximately 25 ms. As an example, the optical molasses stage 104 is not limited to as described herein, and may not be necessary for the atom interferometry described herein.

At a time $T_2$, the measurement cycle transitions to an atom state preparation stage 106. At the time $T_2$, the substantially uniform magnetic field, such as provided by the uniform magnetic field generator 70, is activated. Thus, the atom state preparation stage 106 sets the conditions to begin an interrogation during the given measurement cycle. As an example, the atom state preparation stage 106 can have a duration of approximately 2 ms.

At a time $T_3$, an interrogation stage 108 begins. The interrogation stage 108 corresponds to the interrogation stage during which the first and second interrogation beams $OPT_{INT1+}$ and $OPT_{INT2+}$ are provided through the sensor cell 56. As described previously, in response to the pumping and the substantially uniform magnetic field, the alkali metal atoms 54 can be interrogated to be driven from a first energy state to an intermediate state in response to a photon being absorbed from the first interrogation beam $OPT_{INT1+}$ while being insensitive to the second interrogation beam $OPT_{INT2+}$. The alkali metal atoms 54 can then (e.g., subsequently or substantially concurrently) be interrogated to drop from the intermediate state to a second energy state based on emission of a photon in response to the second interrogation beam $OPT_{INT2-}$ while being insensitive to the second interrogation beam $OPT_{INT1-}$. Accordingly, the alkali metal atoms 54 can exhibit a net momentum gain of two photons, given that the momentum change of the population of the alkali metal atoms 54 from absorption and emission of the photon are in the same approximate direction based on the counter-propagation of the first interrogation beam $OPT_{INT1+}$ and the second interrogation beam $OPT_{INT2-}$.

As described previously, the interrogation stage 108 can include multiple interrogation cycles. For example, the interrogation cycles can include providing the interrogation beams $OPT_{INT1}$ and $OPT_{INT2}$ in a first π/2-pulse in which the interrogation beams $OPT_{INT1}$ and $OPT_{INT2}$ are provided at a given intensity for a predetermined time $t_{1/2}$. The first π/2-pulse can thus provide an approximate 50% superposition of the alkali metal atoms in both energy state and momentum state. After a time interval T from the first π/2-pulse, the interrogation cycles can include a it-pulse in which the interrogation beams are provided at an intensity that is approximately twice the amplitude of the first π/2-pulse (or at the same intensity for twice the duration) at a same circular polarization of each of the interrogation beams $OPT_{INT1}$ and $OPT_{INT2}$ to as provided in the first π/2-pulse. The it-pulse can thus operate to reverse the 50% superposition to begin to close the interferometry paths. The interrogation cycles can further include a second it/2-pulse in which the interrogation beams $OPT_{INT1}$ and $OPT_{INT2}$ are provided at the same intensity as the first π/2-pulse for a predetermined time $t_{1/2}$ at the same circular polarization as the first π/2-pulse. The second π/2-pulse can thus provide an approximate 50% superposition of the alkali metal atoms having undergone the energy state transition from the first energy state to the second energy state, and thus having the net momentum in the first momentum direction to restore the alkali metal atoms to a same state as prior to the interrogation stage.

At a time $T_6$, the measurement cycle transitions to a state readout stage 110. At the time $T_6$, the optical trapping beam $OPT_{TRP}$ is reactivated, and the uniform magnetic field is deactivated. During the state readout stage 110, the population state distribution of the alkali metal atoms 54 in the first state (e.g., the state <1,−1> or <1,1>) relative to the second state (e.g., the state <2,1> or <2,−1>, respectively) is measured, such that the population of the alkali metal atoms 54 provide an optical response $OPT_{DET}$ during the state readout stage 110. As an example, the state readout stage 110 can have a duration of approximately 3 ms. Additionally, any inertial effects having occurred on the alkali metal atoms during the interrogation stage 108 can be detected (e.g., based on an optical response), and the measurable parameter (e.g., acceleration, rotation, time, etc.) can be determined.

Figure 4:
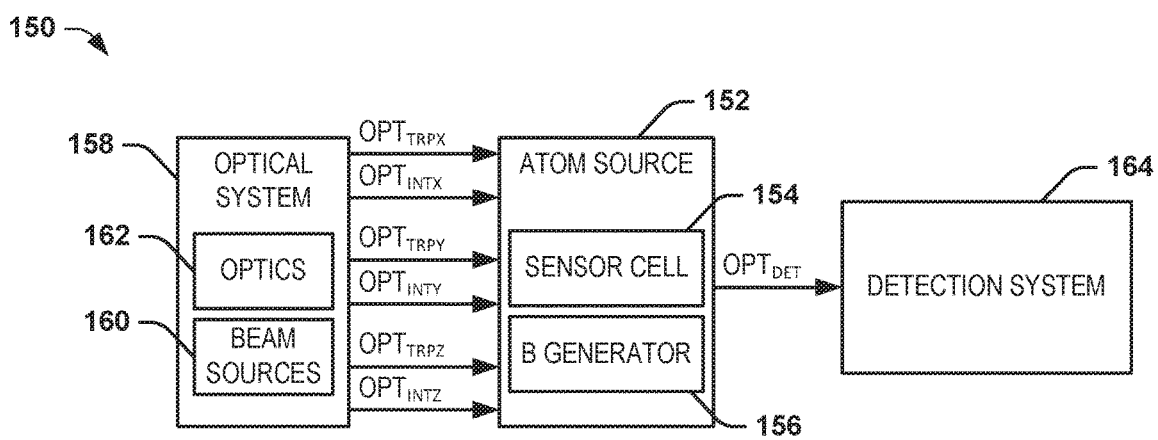
FIG. 4 illustrates yet another example of an atom interferometer system.

FIG. 4 illustrates another example of an atom interferometer system 150. The atom interferometer system 150 can be implemented to determine a measurable parameter based on a sequence of measurement cycles, similar to as described previously. Similar to as described previously in the example of FIG. 1, the atom interferometer system 150 includes an atom source 152 that is configured to trap alkali metal atoms in a sensor cell 154 based on a magnetic field generated by a magnetic field generator 156.

As also described previously in the example of FIG. 1, in each of the measurement cycles, subsequent to the trapping stage, an interrogation stage is initiated. In the example of FIG. 4, the atom interferometer system 150 includes an optical system 158. The optical system 158 includes a plurality of beam sources 160 that are configured to generate optical beams that are provided to the sensor cell 154 via optics 162. In the example of FIG. 4, the atom interferometer system 150 demonstrates that the optical system 158 can provide optical trapping light along each of three approximately orthogonal axes X, Y, and Z, demonstrated as optical trapping beams $OPT_{TRPX}$, $OPT_{TRPY}$, and $OPT_{TRPZ}$. The optical system 158 is also demonstrated as providing pairs of interrogation beams $OPT_{INTX}$, $OPT_{INTY}$, and $OPT_{INTZ}$ along the each of three orthogonal axes X, Y, and Z. For example, the pairs of interrogation beams $OPT_{INTX}$, $OPT_{INTY}$, and $OPT_{INTZ}$ can be provided along the same optical path as the respective optical trapping beams $OPT_{TRPX}$, $OPT_{TRPY}$, and $OPT_{TRPZ}$. As an example, the atom interferometer system 150 can alternately provide measurement along each of the three orthogonal axes in a sequence using the same optics as those that provide the optical trapping of the alkali metal atoms. Therefore, a detection system 164 can provide detection of the pairs of interrogation beams $OPT_{INTX}$, $OPT_{INTY}$, and $OPT_{INTZ}$ to provide for measurement of the measurable parameter(s) along each of three orthogonal axes. While the axes demonstrated in the example of FIG. 4 are demonstrated as the X, Y, and Z orthogonal axes, it is to be understood that measurement along additional or different axes may be implemented by the sensor system 150, and that the X, Y, and Z orthogonal axes are provided by example.

Figure 5:
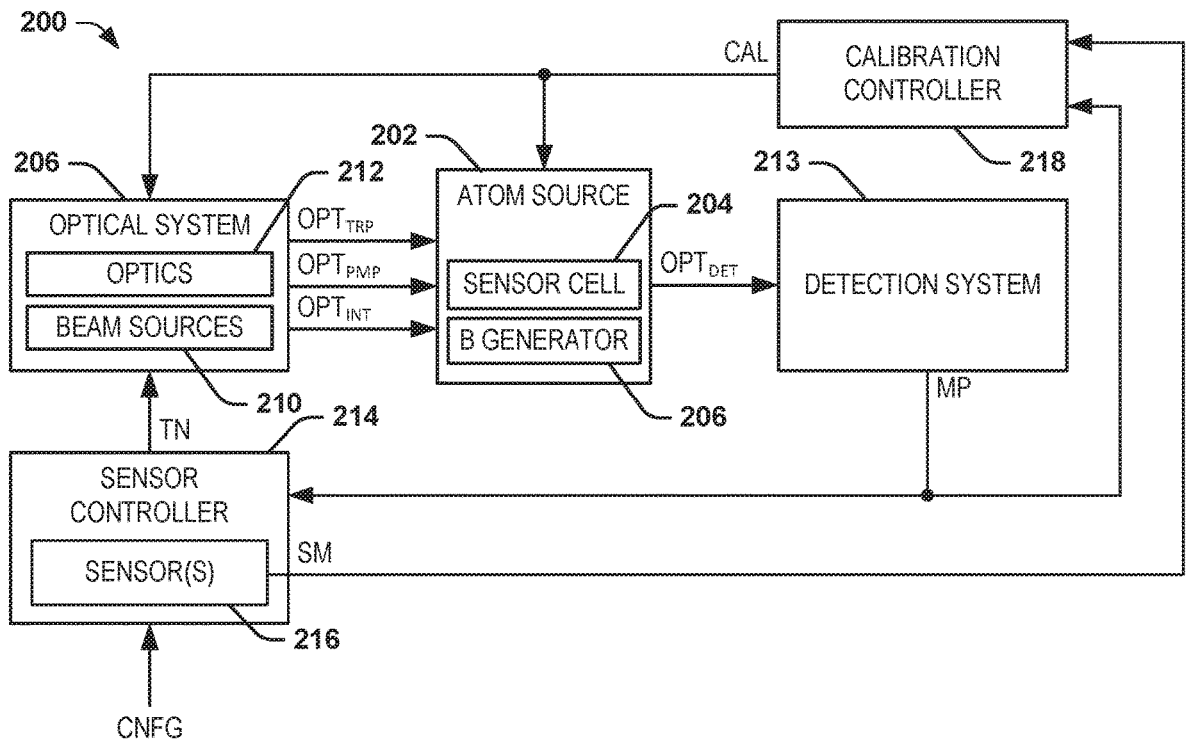
FIG. 5 illustrates an example of a sensor system.

FIG. 5 illustrates an example of a sensor system 200. The sensor system 200 can be configured substantially the same as the atom interferometer systems 10, 50, or 150. For example, the atom interferometer system 200 includes an atom source 202 that is configured to trap alkali metal atoms in a sensor cell 204 based on a magnetic field generated by a magnetic field generator 206. The atom interferometer system 200 also includes an optical system 208. The optical system 208 includes a plurality of beam sources 210 and optics 212 that are configured to generate optical beams that are provided to the sensor cell 204. Accordingly, the sensor system 200 is configured to implement the atom interferometry described previously herein at a detection system 213.

In the example of FIG. 5, the sensor system 200 also includes a sensor controller 214 that includes one or more sensors 216. For example, the sensor(s) 216 can include any of a variety of sensors to measure (or provide) a measurable parameter, such as a crystal oscillator to measure time, a magnetometer to measure magnetic field, an electrometer to measure electric field, an accelerometer to measure acceleration along a sensitive axis, and a gyroscope to measure rotation about a sensitive axis. As an example, the sensor(s) 216 can be configured as auxiliary sensor(s) that may have a lesser precision to facilitate measurement of the measurable parameter(s), as described in greater detail herein.

Figure 6:
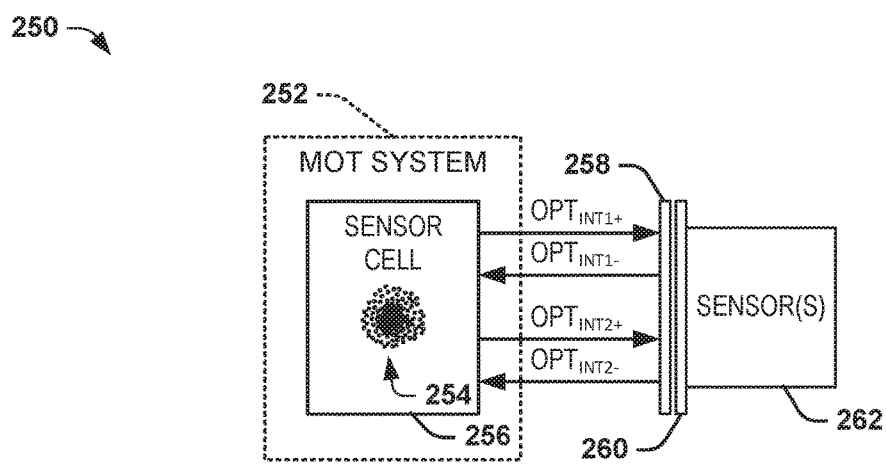
FIG. 6 illustrates another example of a sensor system.

FIG. 6 illustrates another example of a sensor system 250. The sensor system 250 can correspond to a portion of the sensor system 200 in the example of FIG. 5. The sensor system 250 includes an MOT system 252 that is configured to trap alkali metal atoms 254 confined in a sensor cell 256, similar to as described in the example of FIG. 2. In the example of FIG. 6, the atom interferometer system 250 includes a quarter-wave plate 258 and a mirror 260 on an opposite side of the sensor cell 256. For example, the quarter-wave plate 258 and the mirror 260 can be part of the optics (e.g., the optics 22) to provide the first and second interrogation beams $OPT_{INT1+}$ and $OPT_{INT2+}$ having a first circular polarization back through sensor cell 256 in the second direction opposite the first direction at a same circular polarization. For example, the mirror 260 can be a retroreflective mirror to reflect the first and second interrogation beams $OPT_{INT1+}$ and $OPT_{INT2+}$ as first and second interrogation beams $OPT_{INT1-}$ and $OPT_{INT2-}$ back through the sensor cell 256 at the same circular polarization.

The sensor system 250 also includes one or more sensors 262 that are demonstrated as being mounted on a distal surface of the mirror 260 relative to the reflective or retroreflective surface of the mirror 260. The sensor(s) 262 can correspond to the sensor(s) 216 in the example of FIG. 5, and can therefore include any of a variety of sensors to measure (or provide) a measurable parameter, such as a crystal oscillator to measure time, a magnetometer to measure magnetic field, an electrometer to measure electric field, an accelerometer to measure acceleration along a sensitive axis, and a gyroscope to measure rotation about a sensitive axis. Accordingly, the sensor(s) 262 can be arranged as mounted very proximally with respect to the interferometry associated with the MOT system 252 to provide for a capability of the sensor(s) 262 to provide a baseline measurement of the measurable parameter(s), such that the sensor system 250 can provide a very precise refinement to the baseline measurement of the measurable parameter(s) via the interferometry described herein.

Referring back to the example of FIG. 5, the sensor controller 214 receives an input CNFG that can correspond to a user input to configure the atom interferometer system to measure a given one of the measurable parameters, such as any of a variety of predefined measurable parameters that the interferometer can measure. Therefore, the input CNFG can be a selection input to provide selective configuration of the interferometer to measure a desired one of the predefined measurable parameters that the atom interferometer system can support (any two or more of the measurable parameters delineated previously). The sensor controller 214 can therefore provide a tuning signal TN to the optical system to tune the beam sources to provide the capability of measuring the measurable parameter via the interferometer. For example, the tuning signal TN can affect the frequency and/or polarization of the beam sources, and thus the interrogation beams, to provide the capability of the interferometer to measure the respective selected measurable parameter.

The sensor controller 214 receives a signal MP from the detection system 213 that can correspond to the measurement of the respective selected measurable parameter. Therefore, the sensor controller 214 can adjust and/or calibrate the measurable parameter provided from the respective one of the sensor(s) 216 based on the measured parameter as provided by the signal MP. Accordingly, the atom interferometer system 200 can provide aiding in determining a very precise measurement of the measurable parameter to an otherwise less precise one of the sensor(s) 216. Particularly, the sensor(s) 216 can provide a baseline measurement of the measurable parameter(s), such that the sensor system 200 can also provide a very precise and stable refinement to the baseline measurement of the measurable parameter(s) via the interferometry described herein.

In addition, the sensor system 200 includes a calibration system 218. The calibration system 218 is configured to implement calibration of the sensor system 200, particularly with respect to the atom interferometry as described herein. For example, the calibration system 218 can operate during a normal operating mode of the sensor system 200, such that the calibration system 218 can implement self-calibration of the sensor system 200, in which the calibration of the sensory system 200 can be performed substantially continuously during normal operation of the sensor system 200, and thus without an interruption of real-time operation.

In the example of FIG. 5, the calibration system 218 receives the signal MP from the detection system 213, as well as a signal SM from the sensor(s) 216. The signal SM can thus correspond to output signal(s) from the respective sensor(s) 216 that indicate the measurement of the respective measurable parameter(s) by the sensor(s) 216. Therefore, the calibration system 218 is configured to substantially continuously monitor the measurements of the measurable parameter(s) provided by the detection system 213 and the sensor(s) 216. In addition, the calibration system 218 provides a calibration signal CAL to the atom source 202 and/or the optical system 208. The calibration signal CAL can provide an adjustment to at least one of the magnetic field generated by the magnetic field generator 206 and/or the interrogation beams generated by the beam sources 210, such as at periodic intervals of the measurement cycles (e.g., in alternating measurement cycles).

For example, the calibration signal CAL can correspond to a change in circular polarization of the interrogation beams $OPT_{INT}$. Therefore, the population of alkali metal atoms can have a photon-momentum direction change in the interrogation cycles that is opposite in the different calibration measurement cycles (e.g., opposite momentum directions resulting from photon absorption and emission in each of the $\pi$ and $\pi/2$ pulses, such as in each alternating measurement cycle). As another example, the calibration signal CAL can also affect the intensity, activation time, and/or frequency of the beam sources 210 to provide for an approximate equal and opposite effect of the momentum changes resulting from the photon absorption and emission of the interrogation beams $OPT_{INT}$ by the alkali metal atoms. As another example, the calibration signal CAL can reverse the polarity of the transition magnetic field that is generated by the magnetic field generator 206, which can likewise result in a photon-momentum direction change in the interrogation cycles that is opposite in the different calibration measurement cycles (e.g., opposite momentum directions resulting from photon absorption and emission in each of the $\pi$ and $\pi/2$ pulses, such as in each alternating measurement cycle). As another example, the calibration signal CAL can also affect the timing of the interrogation cycle, for example the duration of interrogation pulses, the delay between interrogation pulses, and/or the overall interrogation cycle time. The timing adjustments can also be combined with laser intensity adjustments to modify the duration of the interrogation pulses while maintaining the integration pulse area to preserve the $\pi$ and $\pi/2$ pulse effects. As yet another example, the calibration signal CAL can provide different combinations of changes of the circular polarization of the beam sources 210 and the polarity of the magnetic field generated by the magnetic field generator 206 to implement variations of the effects of absorption and emission of the photons, and the resulting momentum changes of the alkali metal atoms, in the selected measurement cycles.

As described previously, the calibration system 218 is configured to substantially continuously monitor the measurements of the measurable parameter(s) provided by the detection system 213 and the sensor(s) 216. Therefore, the calibration system 218 can be configured to identify the measurements of the measurable parameter(s) based on the adjustments provided by the calibration signal CAL, and thus the effects of the momentum changes of the alkali metal atoms, in a feedback manner. For example, the calibration system 218 can be configured to implement one or more filtering algorithms (e.g., via a Kalman filter, a particle filter, or any of a variety of other types of filtering algorithms) to aggregate the measurements of the measurable parameter(s) over the measurement cycles to identify the effects of the interrogation beams and the magnetic field on the measurements of the measurable parameter(s). Accordingly, the calibration system 218 can be configured to implement self-calibration of the sensor system 200, such as by adjusting parameters associated with the beam sources 210 (e.g., intensity and/or frequency), the magnetic field generator 206 (e.g., intensity and/or direction), or any other part of the sensor system 200 (e.g., temperature) to remove identified bias errors in the measurements of the measurable parameter (s). As another example, in response to rendering the systematic effects of the of the interrogation beams and the magnetic field on the measurements of the measurable parameter(s) observable, the calibration system 218 can merely subtract identified bias errors from the measurements of the measurable parameter(s). For example, the calibration signal CAL can also provide tuning adjustments to the beam sources 210, the magnetic field generator 206, or other components of the sensor system 200. Accordingly, the calibration system 218 can provide for more accurate measurements of the measurable parameter(s) over time and without interruption of operation of the sensor system 200.

Figure 7:
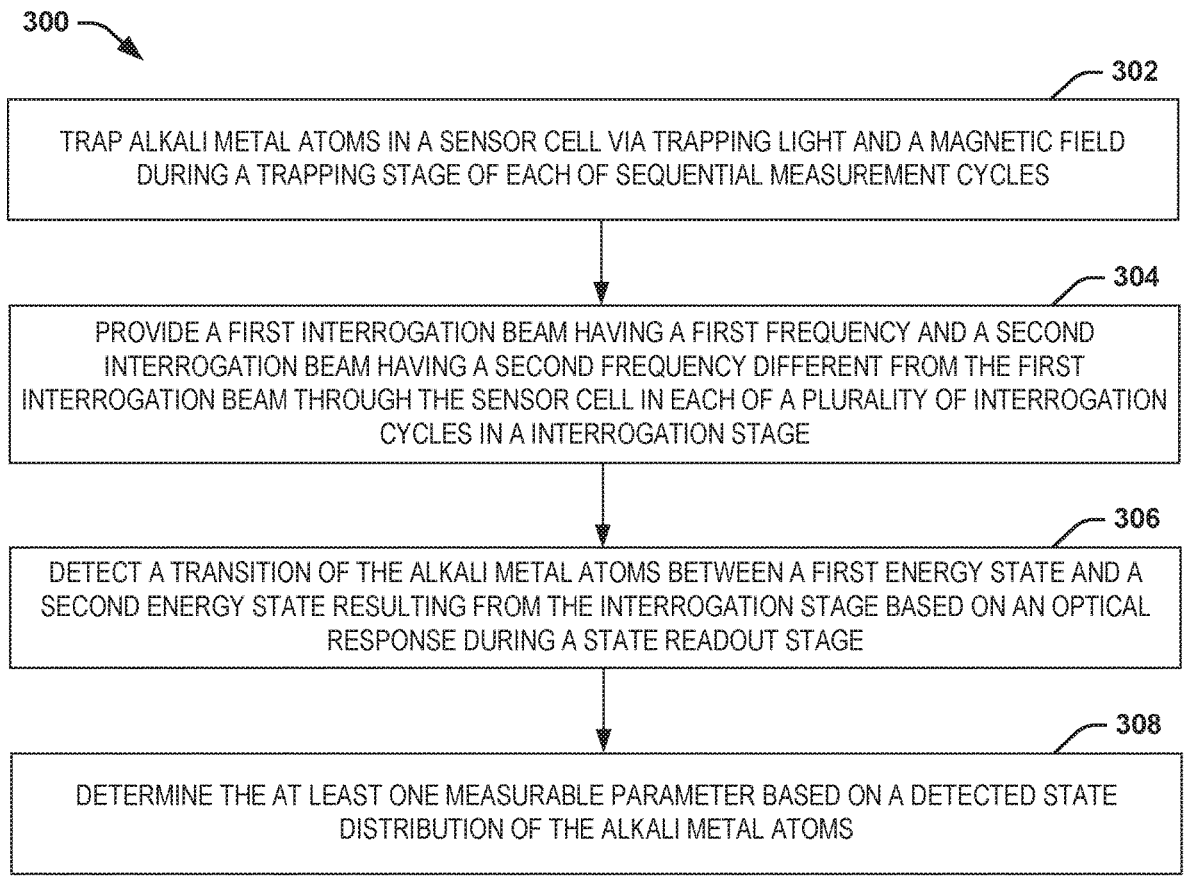
FIG. 7 illustrates an example of a method for measuring at least one measurable parameter via an atom interferometer system.

In view of the foregoing structural and functional features described above, a methodology in accordance with various aspects of the present invention will be better appreciated with reference to FIG. 7. While, for purposes of simplicity of explanation, the methodology of FIG. 7 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 7 illustrates an example of a method 300 for measuring at least one measurable parameter via an atom interferometer system (e.g., the atom interferometer system 10). At 302, alkali metal atoms are trapped in a sensor cell (e.g., the sensor cell 14) via trapping light (e.g., the trapping beam $OPT_{TRP}$) and a magnetic field during a trapping stage of each of sequential measurement cycles. At 304, a first interrogation beam (e.g., the interrogation beam $OPT_{INT1}$) having a first frequency is provided and a second interrogation beam (e.g., the interrogation beam $OPT_{INT2}$) having a second frequency different from the first interrogation beam is provided through the sensor cell in each of a plurality of interrogation cycles in an interrogation stage. The interrogation beams to provide for absorption of photons in a population of the alkali metal atoms via the first frequency to provide a first photon momentum of the population of the alkali metal atoms in a first momentum direction and to provide for emission of photons in the population of the alkali metal atoms via the second frequency to provide a second photon momentum of the population of the alkali metal atoms in the first momentum direction. At 306, a transition of a population of the alkali metal atoms between a first energy state and a second energy state resulting from the interrogation stage is detected based on an optical response during a state readout stage. At 308, the at least one measurable parameter is determined based on the detected state distribution of the alkali metal atoms.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An atom interferometer system comprising:
    a sensor cell comprising alkali metal atoms;
    an optical system that generates a first interrogation beam having a first frequency and a first circular polarization and a second interrogation beam having a second frequency and the first circular polarization, the second frequency being different from the first frequency, the optical system comprising optics that provide the first and second interrogation beams through the sensor cell in a first direction and reflect the first and second interrogation beams back through the sensor cell in a second direction opposite the first direction and in the first circular polarization to drive an energy transition of the alkali metal atoms between a first energy state and a second energy state during an interrogation stage in each of sequential measurement cycles;
    a magnetic field generator configured to provide a uniform magnetic field in the sensor cell, the uniform magnetic field having a magnitude to provide for a transition frequency of the alkali metal atoms that is approximately centered on a quadratic Zeeman-shift of the energy transition of the alkali metal atoms from the first energy state to the second energy state; and
    a detection system that detects a state distribution of the alkali metal atoms between the first energy state to the second energy state during the interrogation stage based on an optical response during a state readout stage in each of the sequential measurement cycles.

2. The system of claim 1, wherein the optical system is configured to provide the first and second interrogation beams through the alkali metal atoms to provide for absorption of photons in a population of the alkali metal atoms via the first frequency of the first interrogation beam in the first circular polarization to provide a first photon momentum of the population of the alkali metal atoms in a first momentum direction, and to provide the reflected first and second interrogation beams through the alkali metal atoms to provide for emission of photons in the population of the alkali metal atoms via the second frequency of the second interrogation beam in the first circular polarization to provide a second photon momentum of the population of the alkali metal atoms in the first momentum direction.

3. The system of claim 1, wherein the optics comprises a quarter-wave plate and a mirror, the mirror being configured to reflect the first and second interrogation beams and the quarter-wave plate being configured to maintain the first circular polarization for each of the first and second interrogation beams in each of the first and second direction.

4. The system of claim 1, wherein the optical system is configured to provide the first and second interrogation beams in each of a first $\pi/2$-pulse, a $\pi$-pulse, and a second $\pi/2$-pulse during the interrogation stage, wherein the detection system is configured to determine at least one measurable parameter based on changes associated with a population of the alkali metal atoms after the second $\pi/2$-pulse during the state readout stage.

5. The system of claim 1, wherein the optical system comprises a trapping beam source configured to generate an optical trapping beam, the system further comprising a magneto-optical trapping (MOT) system, the MOT system comprising:
    a first magnetic field generator configured to generate a trapping magnetic field configured to trap the alkali metal atoms in the cell in response to the optical trapping beam; and a second magnetic field generator configured to generate the uniform magnetic field during the interrogation stage, the uniform magnetic field having an amplitude based on Zeeman-shift characteristics of the alkali metal atoms to drive interrogation of a population of the alkali metal atoms from the first energy state to the second energy state.

6. The system of claim 5, wherein the alkali metal atoms are 87-rubidium atoms, and wherein the uniform magnetic field has a magnitude of approximately 3.23 Gauss.

7. The system of claim 6, wherein the uniform magnetic field has a magnitude to provide for a transition frequency that is approximately centered on an interrogation energy transition of the alkali metal atoms from the first energy state of <1,−1> to the second energy state of <2,1>, or from the first energy state of <1,1> to the second energy state of <2,−1>.

8. The system of claim 5, wherein the optics are configured to provide the first and second interrogation beams and the optical trapping beam through the sensor cell along the same optical path.

9. The system of claim 1, wherein the optical system comprises:
    a trapping beam source configured to provide a first optical trapping beam, a second optical trapping beam, and a third optical trapping beam along respective approximate X, Y, and Z orthogonal axes through the sensor cell via the optics; and
    a first interrogation beam source configured to generate the first interrogation beam and to provide the first interrogation beam along at least one of the respective approximate X, Y, and Z orthogonal axes through the sensor cell via the optics during a respective approximate X, Y, or Z-axis interrogation stage along a same optical path as a respective one of the first, second, and third optical trapping beams; and
    a second interrogation beam source configured to generate the second interrogation beam and to provide the second interrogation beam along the at least one of the respective approximate X, Y, and Z orthogonal axes through the sensor cell via the optics during the respective approximate X, Y, or Z-axis interrogation stage along the same optical path as the respective one of the first, second, and third optical trapping beams.

10. A sensor system comprising the atom interferometer system of claim 1, the sensor system further comprising:
    a sensor controller comprising at least one sensor configured to determine a first measurement of at least one measurable parameter, wherein the atom interferometer system is further configured to provide a second measurement of the at least one measurable parameter and to provide the second measurement to the sensor controller, wherein the sensor controller is configured to refine the first measurement of the at least one measurable parameter based on the second measurement.

11. The sensor system of claim 10, wherein the sensor controller is configured to provide at least one tuning signal to the atom interferometer system to configure the atom interferometer system to adjust at least one parameter associated with the optical system to enable the atom interferometer system to provide the second measurement of one of a plurality of predefined measurable parameters for which the atom interferometer system is configured to provide.

12. The system of claim 11, wherein the plurality of predefined measurable parameters comprises frequency, frequency difference, time, time difference, and at least one inertial parameter.

13. The system of claim 1, further comprising a calibration controller configured to change at least one characteristic associated with at least one of the uniform magnetic field and the first and second interrogation beams in each of at least one measurement cycle to implement calibration of the atom interferometer system during normal operating conditions of the atom interferometer system.

14. The system of claim 13, wherein the calibration controller is configured to change a circular polarization of each of the first and second interrogation beams in each of the at least one measurement cycle to implement the calibration of the atom interferometer system during the normal operating conditions of the atom interferometer system.

15. The system of claim 13, wherein the calibration controller is configured to change a polarity of the magnetic field in each of the at least one measurement cycle to implement the calibration of the atom interferometer system during the normal operating conditions of the atom interferometer system.

16. A method for measuring at least one measurable parameter via an atom interferometer system, the method comprising:
    trapping alkali metal atoms in a sensor cell via trapping light and a magnetic field during a trapping stage of each of sequential measurement cycles;
    providing a uniform magnetic field in the sensor cell, the uniform magnetic field having a magnitude to provide for a transition frequency of the alkali metal atoms that is approximately centered on a quadratic Zeeman-shift of an energy transition of the alkali metal atoms from a first energy state to a second energy state;
    providing a first interrogation beam having a first frequency and a second interrogation beam having a second frequency different from the first interrogation beam through the sensor cell in each of a plurality of interrogation cycles in an interrogation stage to provide for absorption of photons in a population of the alkali metal atoms via the first frequency to provide a first photon momentum of the population of the alkali metal atoms in a first direction and to provide for emission of photons in the population of the alkali metal atoms via the second frequency to provide a second photon momentum of the population of the alkali metal atoms in the first direction;
    detecting a transition of the population of the alkali metal atoms between the first energy state and the second energy state resulting from the interrogation stage based on an optical response during a state readout stage; and
    determining the at least one measurable parameter based on a detected state distribution of the alkali metal atoms.

17. The method of claim 16, wherein providing the first and second interrogation beams comprises providing the first and second interrogation beams in a first direction through the sensor cell in a first direction at a first circular polarization, and in a second direction through the sensor cell in a second direction opposite the first direction and at the first circular polarization via optics.

18. The method of claim 16, wherein providing the first and second interrogation beams comprises providing the first and second interrogation beams in each of the plurality of interrogation cycles comprising a first $\pi/2$-pulse, a $\pi$-pulse, and a second $\pi/2$-pulse during the interrogation stage, wherein detecting the transition comprises detecting changes associated with the population of the alkali metal atoms after the second π/2-pulse during the state readout stage.

19. The method of claim 16, wherein trapping the alkali metal atoms comprises:
   generating an optical trapping beam; and
   generating a trapping magnetic field configured to trap the alkali metal atoms in the cell in response to the optical trapping beam.

20. The method of claim 16, wherein the alkali metal atoms are 87-rubidium atoms, the method further comprising generating a uniform magnetic field at a magnitude of approximately 3.23 Gauss during the interrogation stage to drive interrogation of the population of the alkali metal atoms from the first energy state of <1,−1> to the second energy state of <2,1>, or from the first energy state of <1,1> to the second energy state of <2,−1>.

21. The method of claim 16, wherein trapping the alkali metal atoms comprises trapping the alkali metal atoms via a first optical trapping beam, a second optical trapping beam, and a third optical trapping beam along respective approximate X, Y, and Z orthogonal axes through the sensor cell via the optics, wherein generating the first and second interrogation beams comprises generating each of the first and second interrogation beams along at least one of the respective approximate X, Y, and Z orthogonal axes through the sensor cell via the optics during a respective approximate X, Y, or Z-axis interrogation stage along a same optical path as a respective one of the first, second, and third optical trapping beams via optics.

22. The method of claim 16, wherein determining the at least one measurable parameter comprises determining a first measurement of the at least one measurable parameter via the atom interferometer system, the method further comprising:
   determining a second measurement of the at least one measurable parameter via an auxiliary sensor; and
   refining the second measurement of the at least one measurable parameter based on the first measurement.

23. The method of claim 16, wherein providing the first and second interrogation beams comprises providing the first and second interrogation beams each having a first circular polarization in a first measurement cycle, and wherein determining the at least one measurable parameter comprises determining the at least one measurable parameter based on the detected state distribution of the alkali metal atoms in the first measurement cycle, the method further comprising:
   providing the first and second interrogation beams each having a second circular polarization opposite the first circular polarization in a second measurement cycle;
   determining the at least one measurable parameter based on the detected state distribution of the alkali metal atoms in the second measurement cycle; and
   calibrating the atom interferometer system based on the detected state distribution of the alkali metal atoms in each of the first and second measurement cycles.

24. The method of claim 16, wherein providing the first and second interrogation beams comprises providing the first and second interrogation beams and the uniform magnetic field having a first polarity in a first measurement cycle, and wherein determining the at least one measurable parameter comprises determining the at least one measurable parameter based on the detected state distribution of the alkali metal atoms in the first measurement cycle, the method further comprising:
   providing the first and second interrogation beams and the transition magnetic field having a second polarity in a second measurement cycle;
   determining the at least one measurable parameter based on the detected state distribution of the alkali metal atoms in the second measurement cycle; and
   calibrating the atom interferometer system based on the detected state distribution of the alkali metal atoms in each of the first and second measurement cycles.

25. An atom interferometer system comprising:
   a magneto-optical trapping (MOT) system that traps alkali metal atoms in a sensor cell via a magnetic field and trapping light during a trapping stage of each of measurement cycles;
   an optical system comprising:
      a first interrogation beam source configured to generate a first interrogation beam having a first frequency;
      a second interrogation beam source configured to generate a second interrogation beam having a second frequency different from the first frequency; and
      optics configured to provide the first and second interrogation beams through the sensor cell in a first direction at a first circular polarization to provide for absorption of photons in a population of the alkali metal atoms via the first frequency of the first interrogation beam in the first circular polarization to provide a first photon momentum of the population of the alkali metal atoms in a first momentum direction, and to reflect the first and second interrogation beams through the alkali metal atoms in a second direction opposite the first direction and at the first circular polarization to provide for emission of photons in the population of the alkali metal atoms via the second frequency of the second interrogation beam in the first circular polarization to provide a second photon momentum of the population of the alkali metal atoms in the first momentum direction in each of a plurality of interrogation cycles of an interrogation stage;
   a magnetic field generator configured to provide a uniform magnetic field in the sensor cell, the uniform magnetic field having a magnitude to provide for a transition frequency of the alkali metal atoms that is approximately centered on the energy transition of the alkali metal atoms from the first energy state to the second energy state;
   a detection system that detects a state distribution of the population of the alkali metal atoms between the first energy state and the second energy state induced during the interrogation stage based on an optical response during a state readout stage to measure at least one measurable parameter; and
   a calibration controller configured to change at least one characteristic associated with at least one of the magnetic field and the first and second interrogation beams in each of at least one of the measurement cycle to implement calibration of the atom interferometer system during normal operating conditions of the atom interferometer system.

\* \* \* \* \*